US009711947B2

United States Patent
Ty Tan et al.

(10) Patent No.: US 9,711,947 B2
(45) Date of Patent: *Jul. 18, 2017

(54) VERTICAL-CAVITY SURFACE-EMITTING LASER SYSTEM AND METHOD FOR FABRICATING THE SAME

(75) Inventors: Michael Renne Ty Tan, Menlo Park, CA (US); David A. Fattal, Mountain View, CA (US); Jingjing Li, Palo Alto, CA (US); Raymond G. Beausoleil, Redmond, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 451 days.

This patent is subject to a terminal disclaimer.

(21) Appl. No.: 13/990,009

(22) PCT Filed: Dec. 20, 2010

(86) PCT No.: PCT/US2010/061326
§ 371 (c)(1),
(2), (4) Date: May 28, 2013

(87) PCT Pub. No.: WO2012/087282
PCT Pub. Date: Jun. 28, 2012

(65) Prior Publication Data
US 2013/0272337 A1    Oct. 17, 2013

(51) Int. Cl.
*H01S 3/08* (2006.01)
*H01S 5/183* (2006.01)
(Continued)

(52) U.S. Cl.
CPC ...... *H01S 5/18361* (2013.01); *H01S 5/02284* (2013.01); *H01S 5/1838* (2013.01);
(Continued)

(58) Field of Classification Search
CPC ............. H01S 5/18361; H01S 5/02284; H01S 5/1838; H01S 5/021; H01S 5/18341;
(Continued)

(56) References Cited

U.S. PATENT DOCUMENTS 5,912,913 A    6/1999  Kondow et al.
6,088,376 A    7/2000  O'Brien et al.
(Continued)

FOREIGN PATENT DOCUMENTS

JP    2005-223111 A    8/2005
JP    2007-173550 A    7/2007
(Continued)

OTHER PUBLICATIONS

Ye Zhou, "Subwavelength High-Contrast Grating (HCG) and its Applications in Optoelectronic Devices", Doctor of Philosophy dissertation, Tsinghua University, 2003.*
(Continued)

*Primary Examiner* — Xinning Niu
*Assistant Examiner* — Vu A Vu
(74) *Attorney, Agent, or Firm* — Tarolli, Sundheim, Covell & Tummino L.L.P.

(57) ABSTRACT

A vertical cavity surface emitting laser (VCSEL) system and method of fabrication are included. The VCSEL system includes a first portion comprising a first mirror and a gain region to amplify an optical signal in response to a data signal, the first portion being fabricated on a first wafer. The system also includes a second portion comprising a second mirror that is partially-reflective to couple the optical signal to an optical fiber. The second portion can be fabricated on a second wafer. The system further includes a supporting structure to couple the first and second portions such that the first and second mirrors are arranged as a laser cavity having a predetermined length to resonate the optical signal.

15 Claims, 8 Drawing Sheets

(51) Int. Cl.
*H01S 5/022* (2006.01)
*H01S 5/02* (2006.01)
*H01S 5/42* (2006.01)

(52) U.S. Cl.
CPC ........... *H01S 5/021* (2013.01); *H01S 5/18341* (2013.01); *H01S 5/18366* (2013.01); *H01S 5/18386* (2013.01); *H01S 5/423* (2013.01); *H01S 2301/176* (2013.01)

(58) Field of Classification Search
CPC .. H01S 5/18366; H01S 5/18386; H01S 5/423; H01S 2301/176
USPC ......................................................... 372/107
See application file for complete search history.

(56) References Cited

U.S. PATENT DOCUMENTS

| | | | |
|---|---|---|---|
| 6,328,482 B1* | 12/2001 | Jian | 385/88 |
| 6,669,367 B2* | 12/2003 | Lin et al. | 383/14 |
| 6,810,066 B2 | 10/2004 | Baney et al. | |
| 8,654,812 B2* | 2/2014 | Fattal et al. | 372/50.124 |
| 2003/0012231 A1 | 1/2003 | Tayebati et al. | |
| 2003/0072523 A1 | 4/2003 | Lin et al. | |
| 2003/0185269 A1 | 10/2003 | Gutin | |
| 2010/0265983 A1 | 10/2010 | Adachi et al. | |
| 2012/0001166 A1* | 1/2012 | Doany et al. | 257/43 |

FOREIGN PATENT DOCUMENTS

| | | |
|---|---|---|
| JP | 2010-045385 A | 2/2010 |
| WO | WO-2010138524 A2 | 12/2010 |

OTHER PUBLICATIONS

Fattal, et al.: "Flat Dielectric Grating Reflectors with Focusing Abilities"; Published online: May 2, 2010/DOI: 10.1038/NPHOTON.2010.116, pp. 466-470.

International Search Report, Sep. 28, 2011, PCT Application No. PCT/US2010/061326.

Roelkens, et al.: "SOI Grating Structure for Perfectly Vertical Fiber Coupling"; Photonics Research Group, Ghent University—IMEC, Sint-Pietersineuwstraat 41, B-9000 Ghent, pp. 1-4.

Chung, I-S, et al., Silicon-Photonic Light Source Realized by III-V/Si-grting-Mirror Laser, Applied Physics Letters, Oct. 15, 2010, vol. 97, p. 151113.

Ye Zhou, et.al., High-Index-Contrast Grating (HCG) and Its Applications in Optoelectronic Devices, IEEE Journal of Selected Topics in Quantum Electronics, Sep. 29, 2009, vol. 15, Issue 5, pp. 1485-1499.

* cited by examiner

VERTICAL-CAVITY SURFACE-EMITTING LASER SYSTEM AND METHOD FOR FABRICATING THE SAME

BACKGROUND

A vertical-cavity surface-emitting laser (VCSEL) is a type of semiconductor laser diode with laser beam emission perpendicular from a top surface. VCSELs differ from other types of edge-emitting semiconductor lasers that emit laser beams from surfaces formed by cleaving an individual chip out of a wafer. The perpendicular emission of the laser from a VCSEL allows a VCSEL to be tested at various stages throughout the fabrication process to check for material quality and processing issues, unlike edge-emitting lasers that cannot be tested until the end of a production process. Thus, if an edge-emitting laser does not work at the end of the fabrication process, the production time and the processing materials have been wasted.

DETAILED DESCRIPTION

Figure 1:
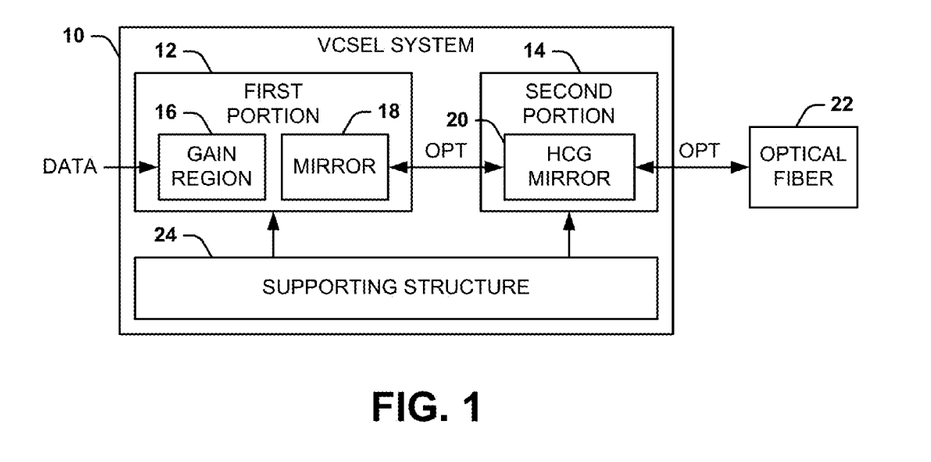
FIG. 1 illustrates an example of a VCSEL system.

FIG. 1 illustrates an example of a vertical-cavity surface-emitting laser (VCSEL) system 10. The VCSEL system 10 can be implemented in a variety of optical applications, such as optical computing and communications. The VCSEL system 10 includes a first portion 12 and a second portion 14. In the example of FIG. 1, the first portion 12 includes a gain region 16 that is configured to generate an optical signal (OPT) in response to a signal (DATA). As an example, the signal (DATA) could be an RF baseband data signal. The first portion 12 also includes a mirror 18. As an example, the mirror 18 can be configured as a multi-layer n-doped distributed Bragg reflector (n-DBR).

The second portion 14 includes a high-contrast grating (HCG) mirror 20. The HCG mirror 20 can be configured as a partially-reflective mirror (e.g., approximately 98% reflective), such that the mirror 18 and the HCG mirror 20 can cooperate to form a laser cavity to resonate the optical signal (OPT). Thus, a portion of the optical signal (OPT) can be emitted from the laser cavity and launched into an optical fiber 22. For example, the optical fiber 22 can be substantially aligned with the HCG mirror 20 based on the fabrication of the second portion 14, as described herein. As an example, the optical fiber 22 can be a single-mode fiber, such as to propagate the optical signal (OPT) for processing at a destination or as part of a multiplexed optical signal, such as based on launching the optical signal (OPT) into a multi-mode fiber.

As an example, the first and second portions 12 and 14 can be fabricated from separate semiconductor wafers. For example, the first portion 12 can merely be fabricated as a VCSEL without an associated second mirror (e.g., HCG mirror). However, the second portion 14 can be fabricated from a separate silicon-on-insulator (SOI) wafer, such as including two layers of silicon (Si) separated by an insulator (e.g., $SiO_2$). As an example, the second portion 14 can be fabricated such that the HCG mirror 20 can be patterned onto one of the layers of silicon of the SOI wafer and the other layer of silicon can be etched to receive the optical fiber 22, such that the HCG mirror 20 can be substantially aligned with the optical fiber 22. As a result, the optical signal (OPT) can be easily coupled into the optical fiber 22 to provide a much more precise output mode of the optical signal (OPT) as launched into the optical fiber 22.

Therefore, because the first and second portions 12 and 14 are fabricated from separate wafers, the first and second portions 12 and 14 can be arranged as separate and independent pieces. Thus, the VCSEL system 10 further includes a supporting structure 24 that is configured to couple the first and second portions 12 and 14 such that the HCG mirror 20 can be substantially aligned with the mirror 18 to form the laser cavity. As an example the supporting structure 24 can include a non-etched portion of the wafer from which the first portion 12 is fabricated, such as bonded to both the first and second portions 12 and 14. Thus, the supporting structure 24 can be easily adjusted, such that the lasing wavelength of the optical signal (OPT) can be easily tuned based on a length of the laser cavity. Accordingly, the VCSEL system 10 can provide numerous advantages over typical monolithic VCSEL systems.

Figure 2:
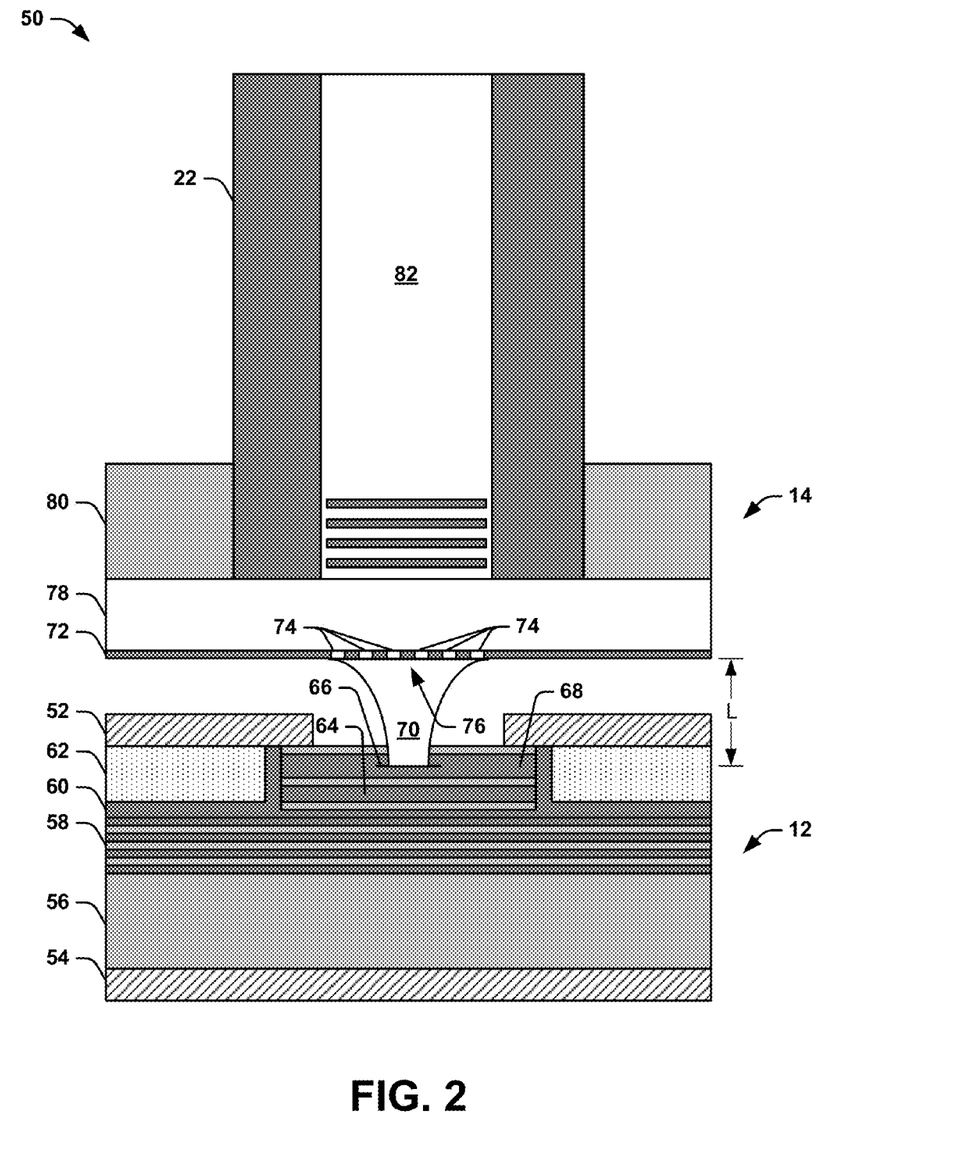
FIG. 2 illustrates an example of a cross-sectional view of a VCSEL system.

FIG. 2 illustrates an example of a cross-sectional view of a VCSEL system 50. The VCSEL system 50 can correspond to the VCSEL system 10 in the example of FIG. 1. Therefore, reference is to be made to the example of FIG. 1 in the following description of the example of FIG. 2.

The VCSEL system 50 demonstrates the first portion 12 and the second portion 14 of the VCSEL system 50. As described above, the first and second portions 12 and 14 can be fabricated separately from separate wafers. The first portion 12 includes a p-contact region 52 and an n-contact region 54 that act as contacts of a diode through which the signal (DATA) passes to generate the optical signal (OPT). The n-contact region 54 is covered by a substrate layer 56. As an example, the substrate layer 56 can be an N-doped gallium arsenide (GaAs) layer. The first portion 12 also includes a multi-layer n-doped DBR 58 that acts as an approximately 100% reflective mirror. The n-doped DBR 58 can thus correspond to the mirror 18 in the VCSEL system 10 in the example of FIG. 1.

The first portion 12 also includes a silicon nitride (SiN) passivation layer 60 and a polyimide 62 that substantially surround a GaAs multiple quantum well (MQW) 64. The MQW 64 acts as a gain region for the signal (DATA) to generate the optical signal (OPT). The optical signal (OPT) is thus generated at the MQW 64 and reflected from the n-doped DBR 58 to be emitted from an aperture 66 in an oxide layer 68. In the example of FIG. 2, the optical signal (OPT) is shown at 70. The first portion 12 can be coupled to the second portion 14 by a supporting structure (not shown), such as the supporting structure 24 in the example of FIG. 1, to suspend the second portion 14 over the first portion 12 by a predetermined amount.

As described in greater detail below, the second portion 14 can be fabricated from an SOI structure. Specifically, the second portion 14 includes a first silicon layer 72 that is separated from the aperture 66 by a distance L. The distance L can be adjusted based on the supporting structure 24 to tune the lasing wavelength of the optical signal (OPT). The first silicon layer 72 can include an etched pattern 74 that can form an HCG mirror 76. The etched pattern 74 can include sub-wavelength etchings into the first silicon layer 72, such as holes, grooves, and/or posts, such that the HCG mirror 76 can be partially-reflective (e.g., 98%). Therefore, the n-doped DBR 58 and the HCG mirror 76 cooperate to act as a laser cavity to resonate the optical signal (OPT). In addition, the HCG mirror 76 can be patterned in a manner to control the shape of the optical signal (OPT) to simulate a curved mirror, such that the optical signal (OPT) is focused into the aperture 66 upon being reflected from the HCG mirror 76. Furthermore, the patterning of the HCG mirror 76 can tune the lasing wavelength of the optical signal (OPT).

The second portion 14 also includes an insulator layer 78, which can be a glass layer such as $SiO_2$. Thus, the insulator layer 78 can be selected to have approximately 0% reflectivity. The insulator layer 78 separates the first silicon layer 72 from a second silicon layer 80. The second silicon layer 80 can be fabricated to have a hole etched down to the insulator layer 78, with the hole being etched at approximately the same location as the HCG mirror 76 on the opposite surface of the insulator layer 78. Thus, the optical fiber 22 can be received in the hole in the second silicon layer 80. The hole in the second silicon layer 80 can be etched to have an inside diameter (ID) that is approximately equal to an outside diameter (OD) of the optical fiber 22, such that the core of the optical fiber 22 can be substantially aligned with the HCG mirror 76. As a result, unreflected energy of the optical signal (OPT) can pass through the HCG mirror 76 to be launched directly into the optical fiber 22.

As an example, the optical fiber 22 can include a single mode core 82, such that the optical fiber 22 can be a single mode fiber. Thus, because the single mode core 82 of the optical signal 22 can be substantially aligned with the HCG mirror 76, the optical signal (OPT) can be coupled into the optical fiber 22 to provide a much more precise output mode of the optical signal (OPT) when launched into the optical fiber 22. In addition, as demonstrated in the example of FIG. 2, the HCG mirror 76 is fabricated such that it is a layer that is coupled to the insulator layer 78, as opposed to being suspended over the aperture 66 via being coupled to the p-contact 52, such as occurring in typical VCSEL systems. Therefore, the laser cavity formed by the n-doped DBR 58 and the HCG mirror 76 experiences much greater spatial stability than in typical VCSEL systems.

Fabrication of the VCSEL system 50 will now be described. In the following description of the examples of FIGS. 3-14, reference is to be made and like reference numbers are made to the example of FIG. 2.

Figure 3:
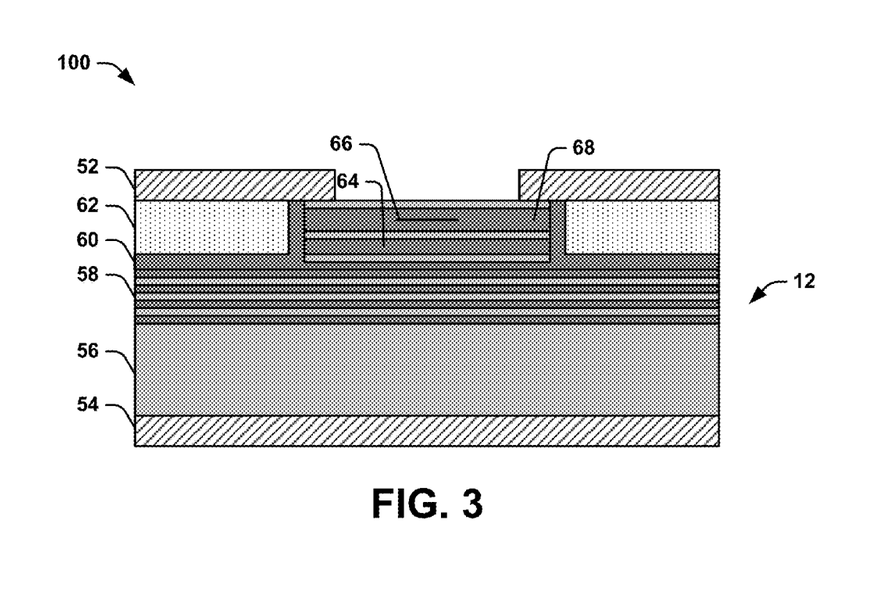
FIG. 3 illustrates an example of a first portion of the VCSEL system of FIG. 2.

FIG. 3 illustrates an example diagram 100 of the first portion 12 of the VCSEL system 50 of FIG. 2. The first portion 12 can be fabricated in a variety of manners to include the p-contact region and n-contact regions 52 and 54, the substrate layer 56, and the multi-layer n-doped DBR 58. In addition, the first portion 100 can be fabricated to include the SiN passivation layer 60, the polyimide 62, and the GaAs MQW 64. Therefore, the first portion 12 can be fabricated such that the first portion 100 is grown as a high-speed oxide-confined VCSEL portion, such that the first portion 12 includes a gain region (e.g., the MQW 64) to generate the optical signal (OPT) and a mirror (e.g., the n-doped DBR 58) to act as part of a laser cavity to resonate the optical signal (OPT).

Figure 4:
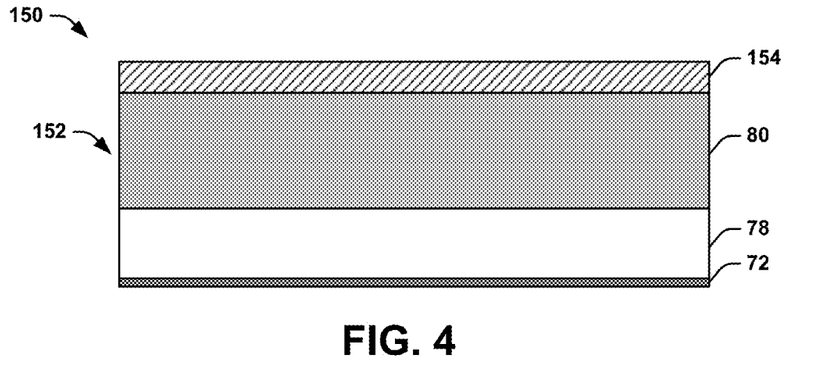
FIG. 4 illustrates an example diagram of a cross-sectional view of an SOI structure including a photoresist layer.

FIG. 4 illustrates an example of a cross-sectional view diagram 150 of an SOI structure 152 including a photoresist layer 154. The SOI structure 152 is demonstrated in the example of FIG. 4 as a portion of an inverted SOI wafer that includes the first silicon layer 72, the insulator layer 78, and the second silicon layer 80, which can act as a substrate during fabrication of the SOI structure 152. As an example, the SOI structure 152 can be formed via a Separation by Implantation of Oxygen (SIMOX) process. The basic steps of the SIMOX process can include implanting oxygen beneath the surface of a silicon wafer. A high temperature annealing step can next be performed to coalesce the implanted oxygen atoms into a uniform layer of $SiO_2$. The annealing step can typically be performed at temperatures greater than 1250° C. for several hours to coalesce the implanted oxygen and achieve solid state recrystallization of the second silicon layer 80 from the surface downward. Thus, as an example, the second silicon layer 80 can be grown to have a thickness of approximately 500 μm.

The SOI structure 152 is also illustrated as including the photoresist layer 154 formed on the second silicon layer 80. The photoresist layer 154 can have a thickness of about 500 Å–5000 Å. However, it is to be appreciated that the thickness thereof may be of any dimension suitable for fabricating the second portion 14. Accordingly, the thickness of the photoresist layer 154 can vary in correspondence with the wavelength of radiation used to pattern the photoresist layer 154. The photoresist layer 154 may be formed over the second silicon layer 80 via conventional spin-coating or spin casting deposition techniques.

Figure 5:
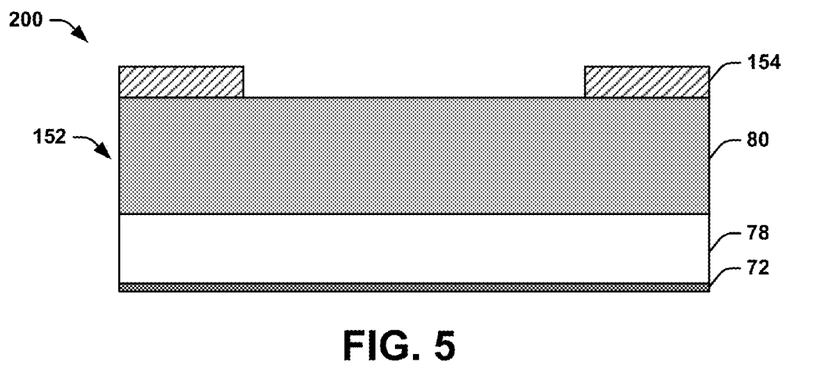
FIG. 5 illustrates an example diagram of the SOI structure of FIG. 4 with the photoresist layer having been patterned.

FIG. 5 illustrates an example diagram 200 of the SOI structure 152 of FIG. 4 with the photoresist layer 154 having been patterned. Specifically, photoresist layer 154 is patterned using conventional techniques to form a hole having an ID that is approximately equal to the OD of the optical fiber 22. As an example, the hole ID can be approximately 125 μm. The patterned photoresist layer 154 can thus serve as an etch mask layer for processing or etching the underlying second silicon layer 80.

Figure 6:
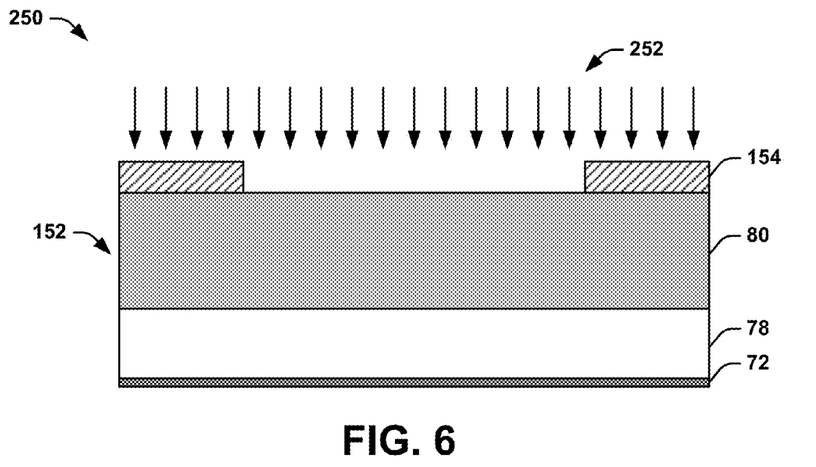
FIG. 6 illustrates an example diagram of the SOI structure of FIG. 5 undergoing an etching step.

FIG. 6 illustrates an example diagram 250 of the SOI structure 152 of FIG. 5 undergoing an etching step. The etch can be an anisotropic deep reactive ion etching (DRIE), as indicated by the arrows 252. Any suitable DRIE etch technique may be used to etch the second silicon layer 80. For example, the second silicon layer 80 can be anisotropically etched with one or more plasma gases, such as carbon tetrafluoride ($CF_4$) containing fluorine ions, in a commercially available etcher, such as a parallel plate DRIE apparatus or, alternatively, an electron cyclotron resonance (ECR) plasma reactor to replicate the mask pattern of the patterned photoresist layer 154.

Figure 7:
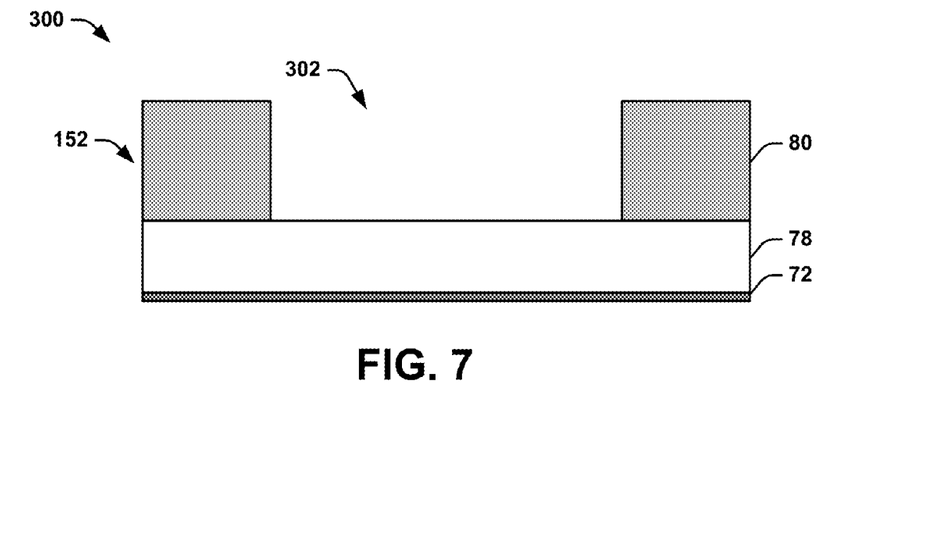
FIG. 7 illustrates an example diagram of the SOI structure of FIG. 6 after the etching step is substantially complete.
Figure 8:
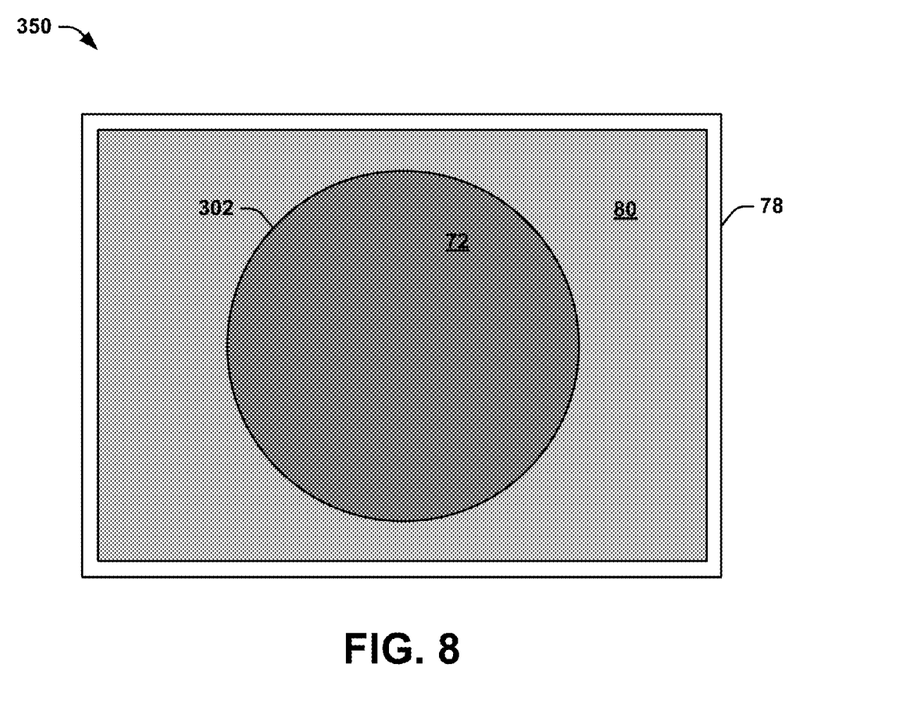
FIG. 8 illustrates an example diagram of a top view of the SOI structure of FIG. 7.

FIG. 7 illustrates an example diagram 300 of the SOI structure 152 of FIG. 6 after the etching step is substantially complete. Specifically, the diagram 300 illustrates a partially complete SOI structure 152 after a stripping step (e.g., ashing in an $O_2$ plasma) is substantially complete to remove remaining portions of the patterned photoresist layer 154. Therefore, the SOI structure 152 includes a hole 302 that has been etched via the DRIE etch process of the example of FIG. 6 in the second silicon layer 80. The DRIE etch process is thus demonstrated in the example of FIG. 7 as having etched the second silicon layer 80 completely down to the insulator layer 78, such that the hole can have a depth of approximately 500 μm. FIG. 8 illustrates an example diagram 350 of a top view of the SOI structure 152 of FIG. 7. In the example of FIG. 8, the hole 302 is demonstrated as having a substantially round dimension. However, it is to be understood that the hole 302 could have a variety of types of dimensions, such as being rectangular, oval, or irregular.

Figure 9:
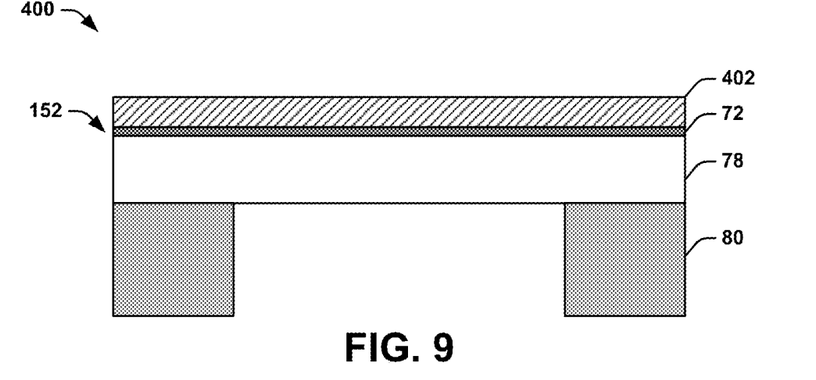
FIG. 9 illustrates an example diagram of a cross-sectional view of the SOI structure of FIG. 7 with a photoresist layer.

FIG. 9 illustrates an example diagram 400 of a cross-sectional view of the SOI structure 152 of FIG. 7 with a photoresist layer 402. In the example of FIG. 9, the SOI structure 152 is demonstrated as having been inverted, such as that the SOI structure 152 is demonstrated as upside-down relative to as demonstrated in the examples of FIGS. 4-8, and thus oriented the same as a typical SOI wafer. The SOI structure 152 thus still includes the first silicon layer 72, the insulator layer 78, and the second silicon layer 80. The SOI structure 152 is also illustrated as including the photoresist layer 402 formed on the first silicon layer 72. The photoresist layer 402 can have a thickness suitable for fabricating the second portion 14 (e.g., about 500 Å–5000 Å), such as based on the wavelength of radiation used to pattern the photoresist layer 402. The photoresist layer 402 may be formed over the first silicon layer 72 via conventional spin-coating or spin casting deposition techniques.

Figure 10:
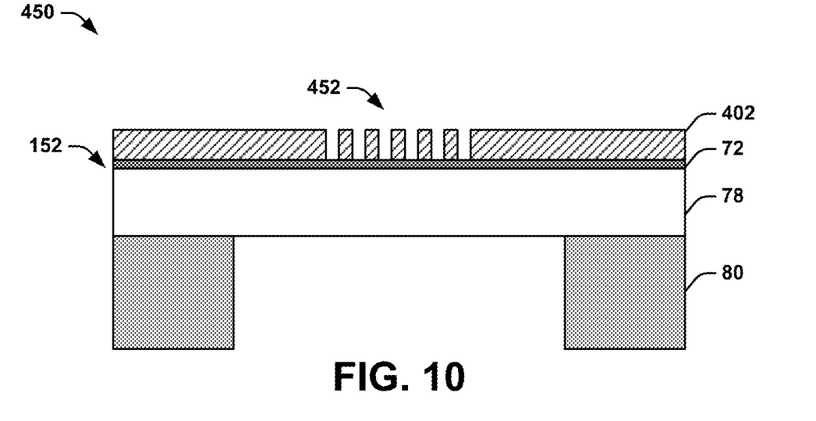
FIG. 10 illustrates an example diagram of the SOI structure of FIG. 9 with the photoresist layer having been patterned.

FIG. 10 illustrates an example diagram 450 of the SOI structure 152 of FIG. 9 with the photoresist layer 402 having been patterned. Specifically, photoresist layer 154 is patterned using conventional techniques to form a plurality of openings 452. The patterned photoresist layer 402 can thus serve as an etch mask layer for processing or etching the underlying first silicon layer 72 to form sub-wavelength etchings that act as a partially-reflective grating.

Figure 11:
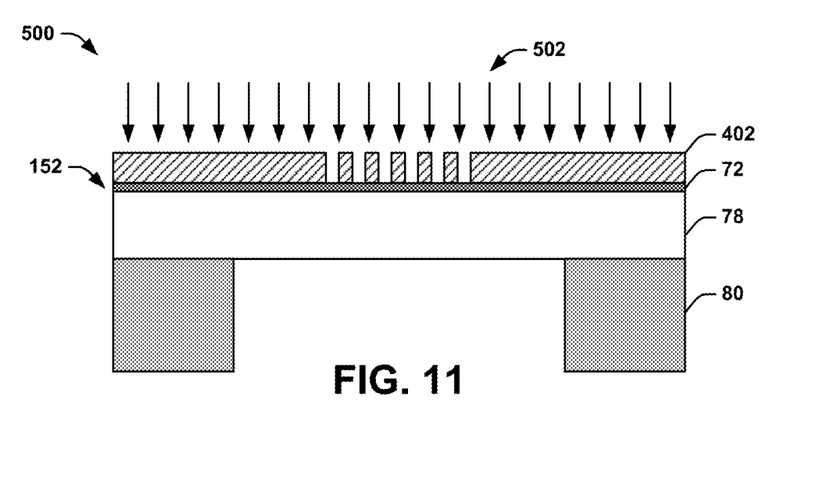
FIG. 11 illustrates an example diagram of the SOI structure of FIG. 10 undergoing an etching step.

FIG. 11 illustrates an example diagram 500 of the SOI structure 152 of FIG. 10 undergoing an etching step. The etch can be an anisotropic DRIE etch, as indicated by the arrows 502. Any suitable DRIE etch technique may be used to etch the first silicon layer 72. For example, the first silicon layer 72 can be anisotropically etched with one or more plasma gases, such as carbon tetrafloride ($CF_4$) containing fluorine ions, in a commercially available etcher, such as a parallel plate DRIE apparatus or, alternatively, an electron cyclotron resonance (ECR) plasma reactor to replicate the mask pattern of the patterned photoresist layer 402. However, it is to be understood that other etching techniques can be implemented in the etching step described in the example of FIG. 11.

Figure 12:
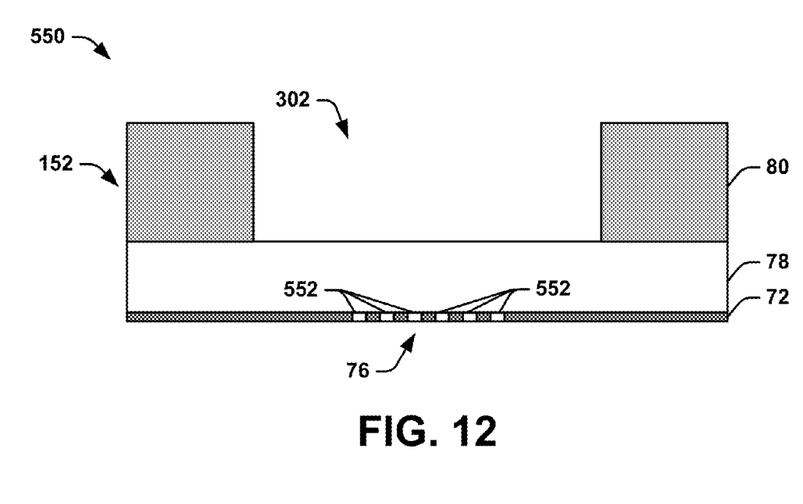
FIG. 12 illustrates an example diagram of the SOI structure of FIG. 11 after the etching step is substantially complete.
Figure 13:
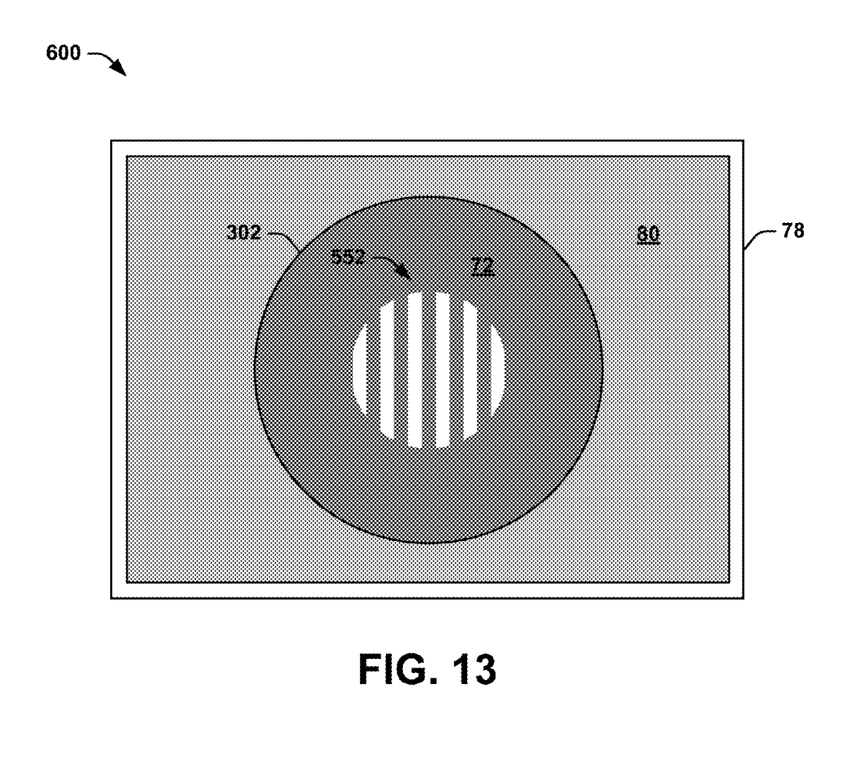
FIG. 13 illustrates an example diagram of a top view of the SOI structure of FIG. 12.

FIG. 12 illustrates an example diagram 550 of the SOI structure 152 of FIG. 11 after the etching step is substantially complete. Specifically, the diagram 550 illustrates a view of the complete second portion 14 after a stripping step is substantially complete to remove remaining portions of the patterned photoresist layer 402. Therefore, the SOI structure 152 includes an etched pattern 552 that have been etched via the DRIE etch process of the example of FIG. 11 in the first silicon layer 72 corresponding to the openings 452 that were patterned into the photoresist layer 402 (e.g., to form a grating). Thus, the etching of the openings 552 corresponds to the patterning of the HCG mirror 76 on the first silicon layer 72. FIG. 13 illustrates an example diagram 600 of a top view of the SOI structure 152 of FIG. 12. In the example of FIG. 13, the openings 552 constituting the HCG grating 76 are demonstrated as being substantially centered with the hole 302 and are substantially enclosed in a circular outer diameter that is concentric with the hole 302.

Figure 14:
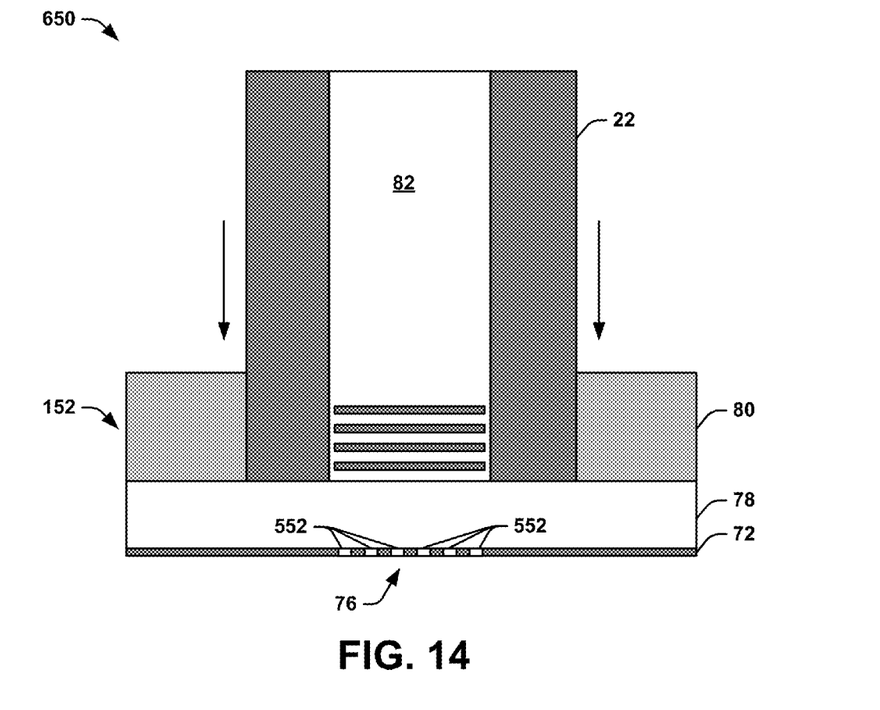
FIG. 14 illustrates an example diagram of a cross-sectional view of the SOI structure of FIG. 12 being coupled with an optical fiber.

FIG. 14 illustrates an example diagram 650 of a cross-sectional view of the second portion 14 of FIG. 12 being coupled with the optical fiber 22. The optical fiber 22 is received within the hole 302, such that the OD of the optical fiber 22 is substantially flush with the ID of the hole 302. The optical fiber 22 can then be butt-coupled directly to the insulator layer 78. As a result, the single-mode core 82 is substantially aligned with the HCG mirror 76 formed by the openings 552 on the opposite surface. Accordingly, the supporting structure 22 can suspend the completed second portion 14 over the first portion 12, such that the optical signal (OPT) can be resonated by the n-doped DBR 58 and the HCG mirror 76 and launched into the optical fiber 22.

Figure 15:
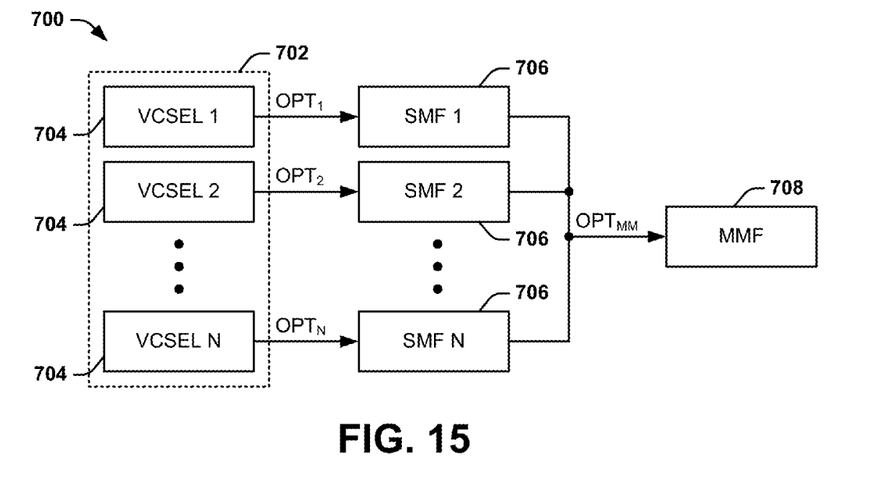
FIG. 15 illustrates an example of a VCSEL system array.

FIG. 15 illustrates an example of a VCSEL system array 700. The VCSEL array system 700 includes an array 702 of VCSEL systems 704, numbered in the example of FIG. 15 from 1 to N, where N is a positive integer greater than one. Each of the VCSEL systems 704 can be configured substantially similar to the VCSEL system 50 in the example of FIG. 2. As an example, each of the VCSEL systems 704 can include a first portion and a second portion that are each fabricated from separate wafers. More specifically, all of the first portions of the VCSEL systems 704 can be fabricated from a single wafer and all of the second portions of the VCSEL systems 704 can be fabricated from a separate single wafer, such as an SOI wafer.

Each of the VCSEL systems 704 generates a respective optical signal, demonstrated as optical signals $OPT_1$ through $OPT_N$ in the example of FIG. 15, that are launched into respective single mode optical fibers 706, respectively numbered 1 through N. Each of the single mode optical fibers 706 can be coupled to each of the respective VCSEL systems 704 in a manner similar to the coupling of the optical fiber 22 to the second portion 14, similar to as demonstrated in the example of FIG. 14 in which the optical fiber 22 has an OD that is approximately the same as the ID of the etched hole in the second silicon layer 80. Therefore, the single mode optical fibers 706 are each substantially aligned with the laser cavities of the VCSEL systems 704, such that the optical signals $OPT_1$ through $OPT_N$ are directly coupled into the single mode optical fibers 706. The optical signals $OPT_1$ through $OPT_N$ can then propagate through the respective single mode optical fibers 706 and be collectively launched into a multi-mode fiber 708 having a multi-mode core. As a result, the optical signals $OPT_1$ through $OPT_N$ can be multiplexed, such as wavelength division multiplexed, polarization multiplexed, and/or time-division multiplexed, within the multi-mode fiber 708.

Figure 16:
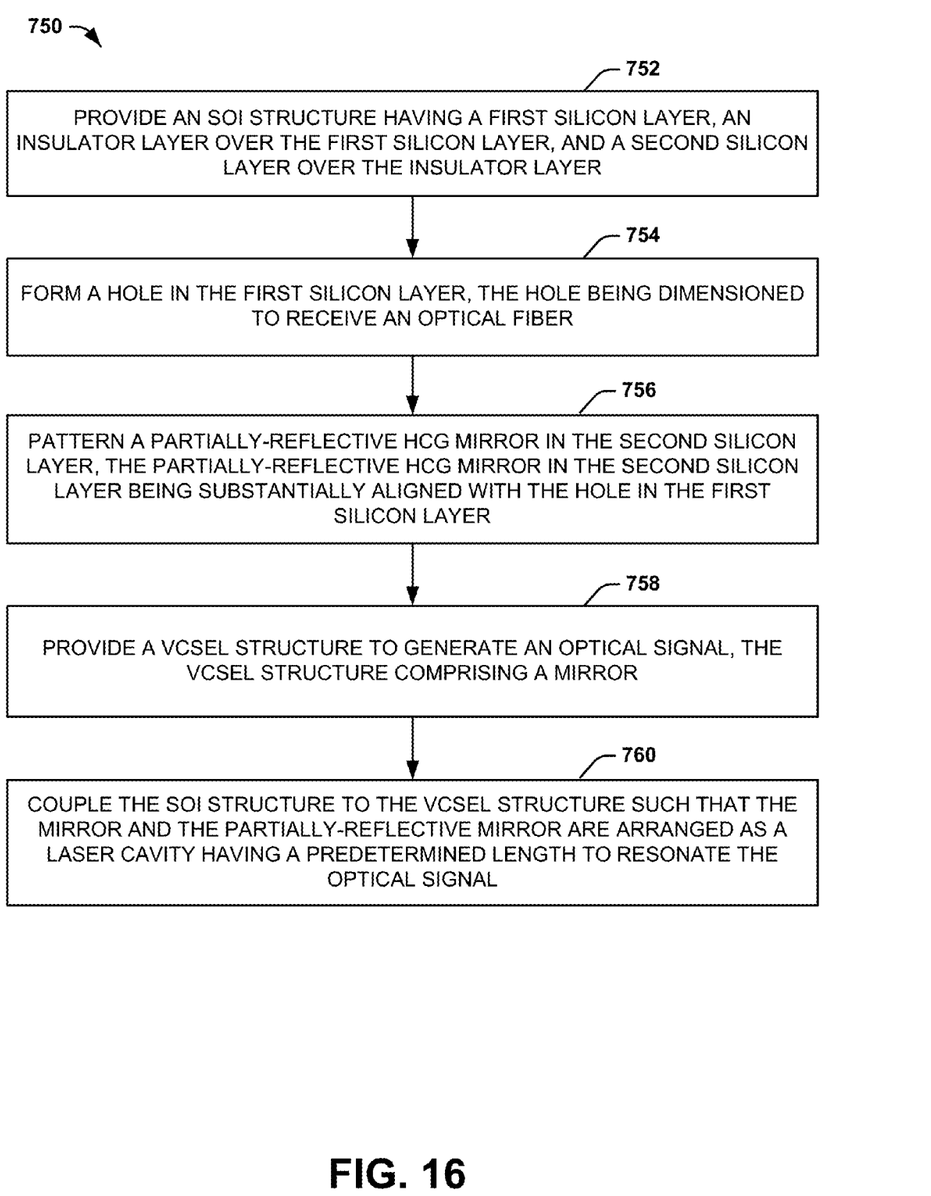
FIG. 16 illustrates an example of a method for fabricating a VCSEL system.

In view of the foregoing structural and functional features described above, an example method will be better appreciated with reference to FIG. 16. While, for purposes of simplicity of explanation, the method of FIG. 16 is shown and described as executing serially, it is to be understood and appreciated that the method is not limited by the illustrated order, as parts of the method could occur in different orders and/or concurrently from that shown and described herein.

FIG. 16 illustrates an example of a method 750 for capturing a photograph of a subject. At 752, an SOI structure having a first silicon layer, an insulator layer over the first silicon layer, and a second silicon layer over the insulator layer is provided. At 754, a hole is formed in the first silicon layer, the hole being dimensioned to receive an optical fiber. At 756, a partially-reflective high-contrast grating (HCG) mirror is patterned in the second silicon layer, the partially-reflective HCG mirror in the second silicon layer being substantially aligned with the hole in the first silicon layer. At 758, a VCSEL structure is provided to generate an optical signal, the VCSEL structure comprising a mirror. At 760, the SOI structure is coupled to the VCSEL structure such that the mirror and the partially-reflective mirror are arranged as a laser cavity having a predetermined length to resonate the optical signal What have been described above are examples. It is, of course, not possible to describe every conceivable combination of components or methodologies, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements.

What is claimed is:

1. A vertical cavity surface emitting laser (VCSEL) system comprising:
    a first portion comprising a first mirror and a gain region to amplify an optical signal in response to a data signal, the first portion being fabricated on a first wafer;
    a second portion comprising a second mirror that is partially-reflective to couple the optical signal to an optical fiber, the second portion being fabricated on a second wafer; and
    a supporting structure to couple the first and second portions such that the first and second mirrors are arranged as a laser cavity having a predetermined length to resonate the optical signal.

2. The system of claim 1, wherein the second wafer is a silicon-on-insulator (SOI) wafer comprising a first silicon layer, an insulator layer over the first silicon layer, and a second silicon layer over the insulator layer.

3. The system of claim 2, wherein the second mirror comprises a high-contrast grating (HCG) mirror that is patterned on the first silicon layer.

4. The system of claim 3, wherein the first portion comprises an aperture through which the optical signal resonates between the first and second mirrors, the HCG mirror focusing the optical signal through the aperture.

5. The system of claim 3, wherein a lasing wavelength of the optical signal is determined based on at least one of a mirror phase of the HCG mirror and the predetermined length of the laser cavity.

6. The system of claim 1, wherein the second portion comprises a hole etched in a silicon layer on a first surface of the second portion, the hole being substantially aligned with the second mirror on a second surface of the second portion opposite the first surface.

7. The system of claim 6, wherein the hole receives the optical fiber, such that the optical fiber is substantially aligned with the second mirror.

8. A laser array comprising a plurality of the VCSEL systems of claim 1, each of the plurality of VCSEL systems generating respective optical signals that are launched into a multi-mode optical fiber.

9. A method for fabricating a vertical cavity surface emitting laser (VCSEL) system, the method comprising:
    providing a silicon-on-insulator (SOI) structure having a first silicon layer, an insulator layer over the first silicon layer, and a second silicon layer over the insulator layer;
    forming a hole in the first silicon layer, the hole being dimensioned to receive an optical fiber subsequent to fabrication;
    patterning a partially-reflective high-contrast grating (HCG) mirror in the second silicon layer, the partially-reflective HCG mirror in the second silicon layer being substantially aligned with the hole in the first silicon layer;
    providing a VCSEL structure that amplifies an optical signal, the VCSEL structure comprising a mirror; and
    coupling the SOI structure to the VCSEL structure such that the mirror and the partially-reflective HCG mirror are arranged as a laser cavity having a predetermined length to resonate the optical signal.

10. The method of claim 9, wherein forming the hole in the first silicon layer comprises:
    patterning a photoresist material to form a mask for the hole; and
    performing a reactive-ion etch to form the hole in the first silicon layer.

11. The method of claim 9, wherein patterning the partially-reflective HCG mirror in the second silicon layer comprises:
    patterning a photoresist material to form a mask for the partially-reflective HCG mirror; and
    performing a reactive-ion etch to form the partially-reflective HCG mirror in the first silicon layer.

12. The method of claim 9, further comprising selecting the predetermined length of the laser cavity to tune a lasing wavelength of the optical signal.

13. The method of claim 9, wherein patterning the partially-reflective HCG mirror comprises tuning the lasing wavelength of the optical signal based on the mask for the partially-reflective HCG mirror.

14. The method of claim 9, wherein providing the VCSEL structure comprises providing the VCSEL structure having an aperture in an oxide layer through which the partially-reflective HCG mirror focuses the optical signal to resonate the optical signal between the mirror and the partially-reflective HCG mirror.

15. The method of claim 9, wherein forming the hole in the first silicon layer comprises forming the hole to have an inner diameter (ID) that is approximately equal to an outer diameter (OD) of the optical fiber, such that the optical fiber is substantially aligned with the partially-reflective HCG mirror upon being received in the hole in the first silicon layer.

* * * * *